United States Patent
Nozuyama

[11] Patent Number: 6,101,623
[45] Date of Patent: Aug. 8, 2000

[54] CURRENT REDUCTION CIRCUIT FOR TESTING PURPOSE

[75] Inventor: Yasuyuki Nozuyama, Tokyo, Japan

[73] Assignee: Kabushiki Kaisha Toshiba, Kawasaki, Japan

[21] Appl. No.: 08/779,892

[22] Filed: Jan. 7, 1997

Related U.S. Application Data

[62] Division of application No. 08/077,648, Jun. 17, 1993, Pat. No. 5,592,494.

[30] Foreign Application Priority Data

Jun. 17, 1992 [JP] Japan .................................. 4-158103
Feb. 24, 1993 [JP] Japan .................................. 5-034972

[51] Int. Cl.[7] .................................................. G01R 31/28
[52] U.S. Cl. .......................................... 714/733; 714/724
[58] Field of Search ...................... 365/189.02; 364/483; 714/733, 718, 721, 724, 725, 734, 745

[56] References Cited

U.S. PATENT DOCUMENTS 4,718,042  1/1988  Moll et al. .............................. 365/201
5,019,772  5/1991  Dreibelbis et al. ................. 324/158 R
5,051,995  9/1991  Tobita ..................................... 371/21.1
5,388,077  2/1995  Sanada .................................... 365/201
5,592,294  1/1997  Nozuyama ............................. 371/22.5

FOREIGN PATENT DOCUMENTS

60-223217  11/1985  Japan .
60-223218  11/1985  Japan .
5-3605     1/1993   Japan .
5-3606     1/1993   Japan .

Primary Examiner—Hoa T. Nguyen
Attorney, Agent, or Firm—Foley & Lardner

[57] ABSTRACT

A detecting and testing circuit for detecting a leakage of current from LSI circuits mainly constituted by CMOS devices. The semiconductor integrated circuit includes a first circuit block having an output line in which a logic level responsive to an input signal is supplied through a ratio type or precharged type operation; and a first standby circuit for maintaining the first circuit block at a standby state, wherein a source of a current or electric charge is shut off from the output line on receipt of information by which the standby state is set, and respective logic levels corresponding to an arbitrary input signal is supplied to the output line of the first block circuit at a same potential level as a power supply.

6 Claims, 9 Drawing Sheets

CURRENT REDUCTION CIRCUIT FOR TESTING PURPOSE

This is a divisional, of application Ser. No. 08/077,648, filed Jun. 17, 1993 now U.S. Pat. No. 5,592,494.

BACKGROUND OF THE INVENTION

1. Field of the Invention

The present invention relates to a testing of an large scale integrated (LSI) semiconductor circuit mainly comprising a complementary Metal Oxide Semiconductor (CMOS) circuit, and it particularly relates to a d.c. current reduction circuit utilized for a testing which is capable of accurately detecting a diminutive defect within a semiconductor chip.

2. Description of the Prior Art

Figure 2:
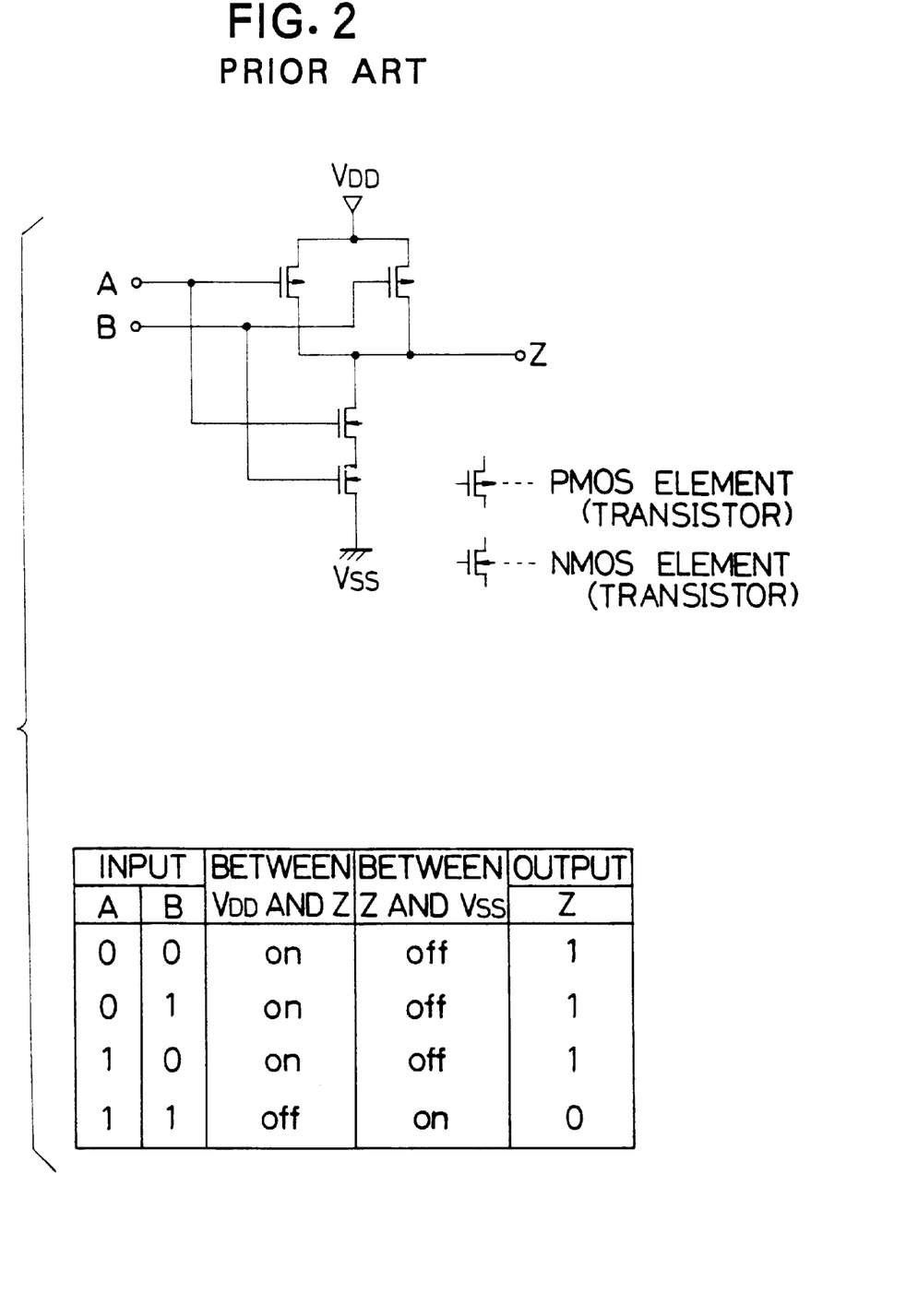
FIG. 2 consists of a CMOS circuit configuration of a two-input NAND gate therein and a table to describe a state of stability thereof.

In a conventional CMOS circuit configured in a complementary manner to combine a PMOS element and an NMOS element, there is presented a circuit structure such that a current path between the VDD side of a high potential of a power supply and the VSS side of a low (or ground) potential is shut off, so that it is known that a very small amount of a leak current (referred to as a standby current hereinafter) flows as shown in FIG. 2., that is, a two-input CMOS NAND where an input thereof and an output thereof are stabilized. For example in this connection, such the standby current is only some to tens of some nA's in a VLSI having one million or more transistors under a design rule of 1.0 $\mu$m at a room temperature. Such current value range remains the same order regardless of any input values.

On the other hand, when there exists even a slight deficiency in the LSI chip constructed by the CMOS circuit, the standby current abnormally increases from a normal case thereof, so that such the defficiency can be easily detected and distinguished from a nondefective. It is rather difficult to detect such the small deficiency by a normal function test, or a test based on design for testability such as a scan test, bulit-in self-test or the like where a circuit in question is evaluated merely by a logical value of an output from a circuit block to be tested.

However, since these defeciencies seem to really appear as an output value error with a high probability as a result of deterioration due to long-term usage thereof, such the deficient chips are desirable to be evaluated as such at the time of delivery thereof so as not be delivered to a product market at all. Accordingly, there is implemented a standby current test for selecting whether a chip is nondefective or not. In the near future, minuteness of a production process of a chip seems to get into a submicron area and, therefore, contributory factors for causing the small leak current described above may substantially increase. Thus, importance of the standby current test is anticipated to increase as well which is capable of detecting small deficiencies existing inside the chip.

Now, by observing generally and carefully LSI circuits constituted by the CMOS circuits, it is easily recognized that there are not many LSI's constituted solely by CMOS circuits. In a case where the circuit is intended to have a less area or is designed to have a high-speed operation therefor, there are oftentimes used (1) a ratio type circuit and (2) a precharged type circuit.

Figure 9A:
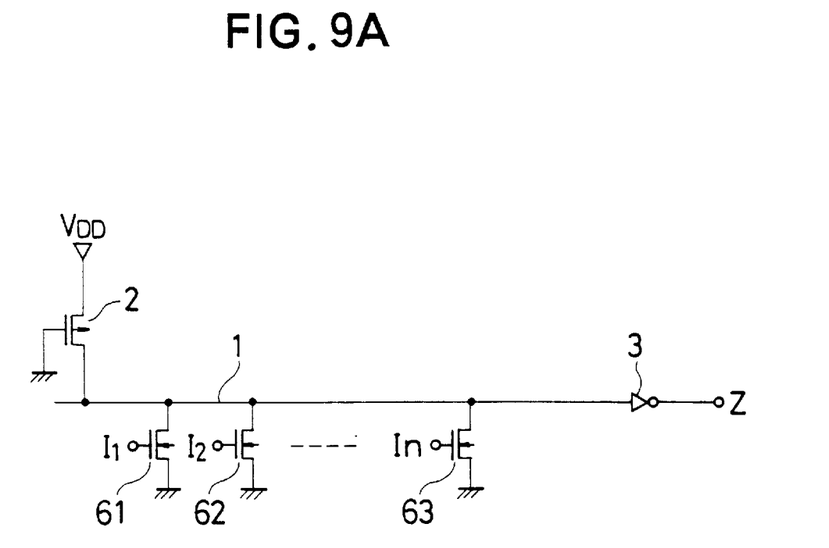
FIG. 9A is a configuration showing a ratio type circuit.

Referring to FIG. 9A, there is shown an example of the ratio type circuit (1). In the same figure, a node 1 which operates in a ratio type manner is connected to an inverter 3 as an input. Then, an output thereof becomes an output Z of this ratio type circuit. A PMOS element 2 which serves to supply a charge from the VDD power supply is grounded at its gate input, so that the PMOS element 2 is constantly in a state of ON. A potential of the node 1 is determined by inputs $I_1$ through $I_n$. When the potential of these inputs are all equal to VSS whose logic is 0 (referred simply to 0 hereinafter), the potential of the node 1 is VDD whose logic is 1 (referred simply to 0 hereinafter), and the potential of output Z becomes VSS.

On the other hand, when the potential of any input among $I_1$ through $I_n$ becomes VDD, corresponding one of NMOS devices $6_1$ through $6_3$ becomes ON. Since a resistance (ON resistance) of the PMOS device 2, while the PMOS device 2 is ON, is designed to be sufficiently higher than that of the NMOS device, the potential of node 1 is sufficiently lower than the logic threshold value of the inverter 3. As a consequence thereof, the potential of output Z becomes VDD.

The ratio type circuit shown in FIG. 9A is a logic sum circuit whose inputs are $I_1, I_2, \ldots, I_n$ (in Boolean expression, $I_1 + I_2 + \ldots + I_n$). In order for the d.c. current not to flow in this circuit, every input potential need be set at VSS, in other words, there is, in most cases, formed a current path from VDD node toward VSS node unless there is a special condition set forth on input combination thereof. Moreover, in these cases, the input of the inverter 3 is not exactly equal to VSS, so that there is formed a d.c. current path in the inverter 3. Therefore, in most input combinations it is almost impossible to detect the small amount of current change in terms of CMOS.

Figure 9B:
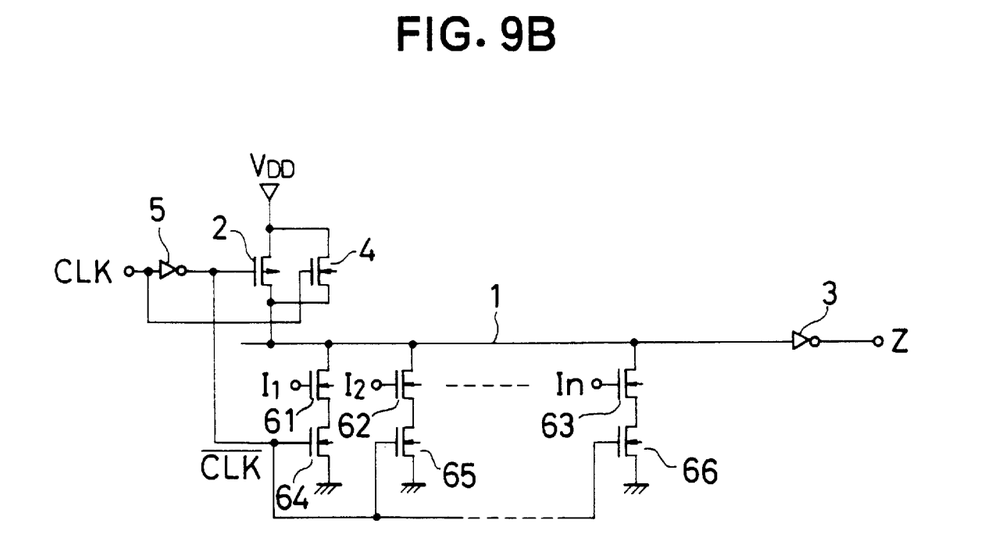
FIG. 9B is a configuration showing a precharge type circuit.

Referring to FIG. 9B, there is shown an example of the precharged type circuit (2). In FIG. 9B, the same numbered parts are identical to those shown in FIG. 9A.

Referring to FIG. 9B, when a clock signal is equal to 1 (CLK=1) (i.e. during precharging), the PMOS element 2 and NMOS element 4 are ON. Then, the node 1 is connected to the power supply (potential Vdd) and NMOS elements $6_4$ through $6_6$ are in the state of OFF. Therefore, the node 1 is precharged up to VDD, regardless of values of input $I_1, I_2, \ldots, I_n$.

Still referring to FIG. 9B, The NMOS elements $6_4$ through $6_6$ serve to suppress a power dissipation by preventing a d.c. current from flowing during the precharging. In a case where such NMOS elements are not required so that a high-speed operation can be achieved, such NMOS elements may not be implemented at all. Though the NMOS element 4 is such that the node 1 is usually precharged up to the potential of (VDD−Vth,n) (where Vth,n denotes a threshold voltage of the NMOS 4), the NMOS 4 can generally perform precharging faster than PMOS element, thus PMOS element being implemented. In this connection, if there is sufficient time allowed until the precharging is completed, there may be utilized the PMOS element 2 alone. On the contrary, there is a case where it suffices to precharge up to the potential of (VDD−Vth,n), and, in this case, the NMOS element 4 alone may be sufficient.

Notice that, hereinafter, a circuit supplying the electric charge to the node from the power supply (potential VDD) will be expressed and denoted by the reference number 100, the node being connected either in the ratio type or the precharge type operation.

Next, when the clock equals to 0 (CLK=0, i.e. during operation), NMOS elements $6_4$ through $6_6$ are ON. Thus, the output of this precharged circuit is determined responsive to inputs $I_1, I_2, \ldots, I_n$. When any one of these inputs is 1, such a corresponding NMOS element, among 61 through 63, becomes ON. Consequently, the electric charge of node 1 is discharged and the logic value thereof becomes 0, thus the output Z being equal to 1.

On the other hand, when every input is 0, every NMOS element ($6_1$ through $6_3$) becomes OFF. Then, the electric charge corresponding to 1 shall be maintained while the node 1 is not connected to the power supply (potential VDD). In this case, the potential of the circuit will change to the value between VDD and VSS as time lapses-due to a leak current thereof. Therefore, a circuit such as an inverter which receives this node as a gate input, becomes weakly ON. As a result thereof, a d.c. current will flow through, so that the small amount of the current is very difficult to be observed in CMOS circuit under a stable state.

As described above, during the precharging, the d.c. current flows through the usual precharge type circuit having therein MOS elements such as $6_4$ through $6_6$ which serve to shut off the d.c current path, so that the standby current test can be executed. However, during operation, similar to the ratio type circuit, there is a case where the standby current test can not be executed depending on the input combination. In a particular case where the NMOS elements are serially connected in which $I_1$ through $I_n$ serve as a gate input, such the standby current test can not be executed for almost every input combination which makes the precharged node unconnected to either power supply.

Notice that, in each ratio type and precharged type circuit, there exist two types: one is that an objective node is connected to VDD side of the power supply so as to supply the electric charge; other is that the objective node is connected to VSS side of the power supply so as to discharge the electric charge.

Accordingly, in the LSI circuits mainly comprising the CMOS circuit including therein some ratio type and precharged type circuits, there exists a strong possibility that the d.c. current may flow unwantedly under the stable state thereof against almost every input combination, so that an effective standby current test can not be executed. On the other hand, as described above, understood is advantageous aspects in the conventional CMOS related LSI circuits, and such the conventional circuits have sometimes been utilized. Now, a basic concept in the conventional manner lies in that there are arranged the ratio type and precharged type circuits so as not to interfere the standby current test. For further detail thereof, there are shown some conventional practices below.

Figure 1:
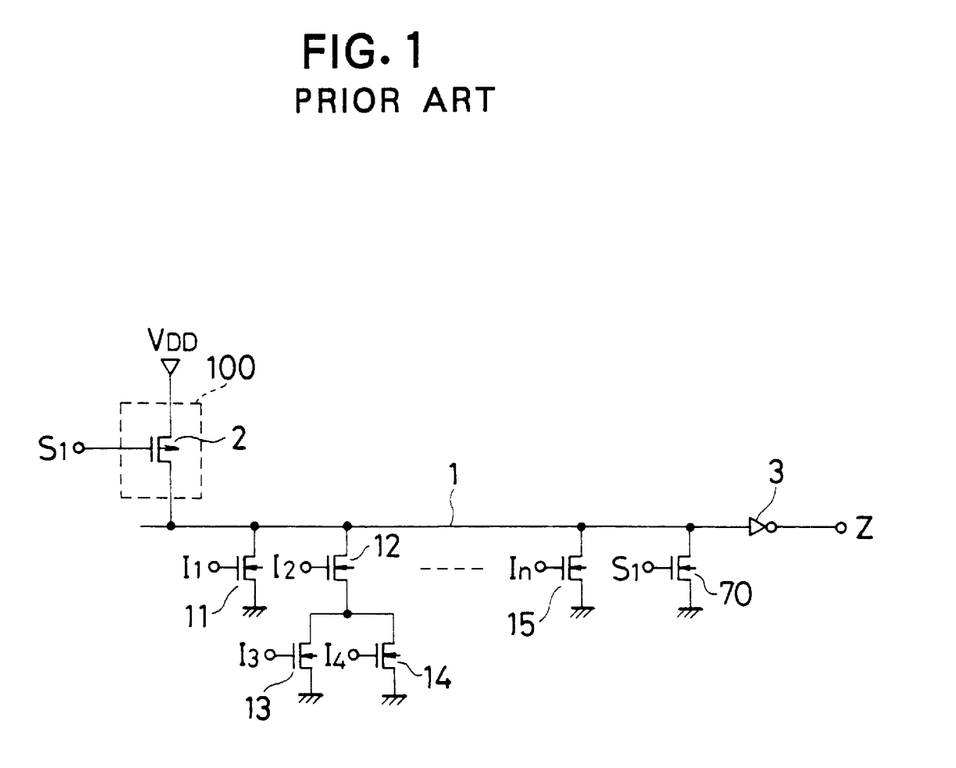
FIG. 1 is a circuit diagram in which the conventional circuit configuration is attached to a ratio type circuit to be tested.

Referring to FIG. 1, there is shown a conventional example of the ratio type circuit. In addition to the inputs $I_1, \ldots, I_n$ in which output z is supplied in a similar way with a normal operation according to the circuit shown in FIG. 9A, the ratio type circuit of FIG. 1 is controlled by input signal $S_1$. In the ratio type circuit shown in FIG. 1, NMOS elements are connected such that output $Z=I_1+I_2 \cdot (I_3+I_4)+ \ldots + I_n$. The input signal $S_1$ controls to switch (ON/OFF) the PMOS element 2, which was on the contrary constantly ON in FIG. 9A. Moreover, the input switch $S_1$ controls to switch the NMOS element 70 which is connected between the output node 1 and VSS.

When the input signal $S_1$ is equal to zero ($S_1=0$), the PMOS element 2 is ON and the NMOS element 70 is OFF. Therefore, the ratio type circuit of FIG. 1 operates normally, in other words, the ratio type circuit of FIG. 1 operates same as in the circuit of FIG. 9A. On the other hand, when $S_1$ is equal to one ($S_1=1$), the PMOS element 2 is OFF which supplies the electric charge to the output node 1 from the power supply (potential VDD) and the NMOS element 70 becomes ON. Consequently, node 1 is fixed to 0 and output Z is thus fixed to 1 (Z=1).

Accordingly, the d.c. current path is shut off at the input signal S1=1, so that the ratio type circuit of FIG. 1 does not detrimentally affect the standby current test of a whole semiconductor chip. As for the precharged circuit, the circuit configuration thereof is designed such that the d.c. current does not flow therethrough during the precharging under normal implementation thereof. Therefore, the standby current test may best be executed during such the precharging. For example, output Z=0 in FIG. 9B.

However, in the conventional practice above mentioned, the standby current test is performed under a state in which the output of the respective ratio type and precharged type circuits is fixed to a certain logic value. Now, in a recent and future trend where a production process for the semiconductor chip enters into a submicron order, there is anticipated that the deficiency accompanied by the small amount of leak current is likely to occur. Therefore, in order to guarantee and secure a long-term reliability of the LSI chips to be delivered to the market, it is indispensable that any slight deficiency in each semiconductor element inside the LSI circuits be detected without fail.

However, in the conventional method in which the fixed value can only be output, each node value inside the LSI circuits can not be set at any possible value, so that an evaluation thereby can only end up incomplete against detecting the slight deficiency in such nodes. Therefore, there have been a great demand for an effective standby current test replacing the conventional practice. As described so far, in the conventional test for LSI circuits mainly comprising CMOS circuits, though the standby current test is carried out which detects the slight deficiency by way of observing the small amount of change in the leak current, the fixed values are output in case of testing the CMOS circuits including the ratio type and precharge type circuits and thus it is hard to carry out such a test sufficiently enough under the conventional practice.

SUMMARY OF THE INVENTION

In view of the foregoing drawbacks, it is therefore an object of the present invention to provide a semiconductor circuit mainly including CMOS devices therein capable of executing a standby current test so as to detect a slight amount of the current-increasing leakage.

To achieve the object, there is provided a semiconductor integrated circuit comprising: a first circuit block having an output line in which a logic level responsive to an input signal is supplied through a ratio type or precharged type operation; and a first standby means for maintaining the first circuit block at a standby state, wherein a source of a current or electric charge is shut off from the output line on receipt of information by which the standby state is set, and respective logic levels corresponding to an arbitrary input signal is supplied to the output line of the first block circuit at a same potential level as a power supply.

Other features and advantages of the present invention will become apparent from the following description taken in conjunction with the accompanying drawings.

BRIEF DESCRIPTION OF THE DRAWINGS

FIGS. 10–12 are circuit configuration whereby there exists aa node therein which generates the d.c. current that hinders the standby current test under even a static state with a determined input/output.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings of FIGS. 3A, 3B to FIG. 13 attached to the specification.

Embodiment No. 1 (ratio type circuit)

Figure 3A:
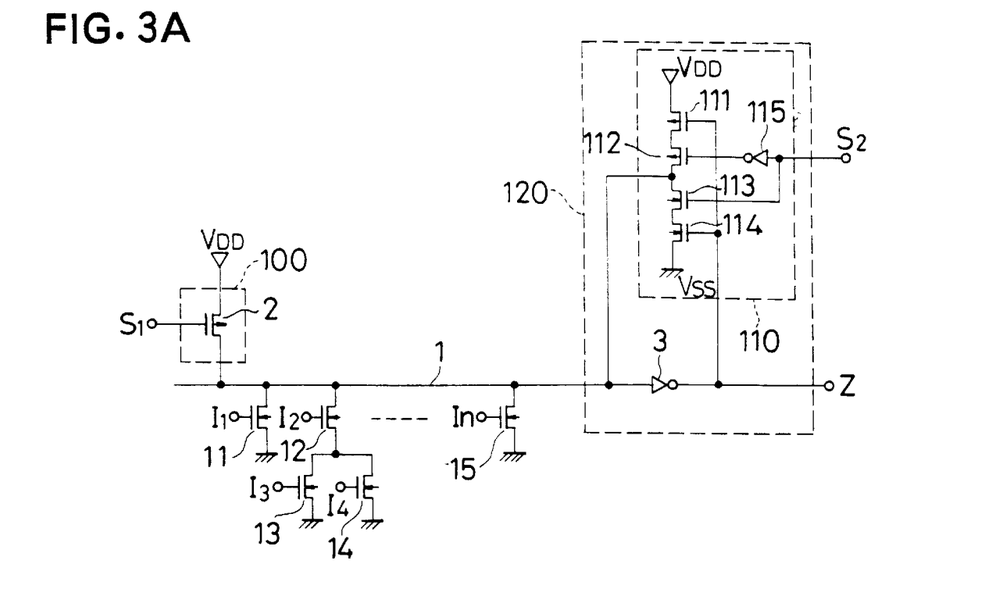
FIG. 3A is a ratio type circuit according to the first embodiment of the present invention.

With reference to FIG. 3A, there is shown the first embodiment of the present invention.

In a ratio type circuit shown in FIG. 3A, a logic output Z is same as the circuit shown in FIG. 1 such that $Z=I_1+I_2\cdot(I_3+I_4)+\ldots+I_n$. A difference from the circuit shown in FIG. 1 lies in a fact that the NMOS element which is switched by a gate signal is eliminated, and, instead, there is attached a circuit 110 comprising a PMOS element 112 and an NMOS element 113 switched ON/OFF by a signal $S_2$, a PMOS element 111 and an NMOS element 114 switched ON/OFF by an output Z, and an inverter 115. The circuit 110 thus comprised is attached as an output to a node 1 which functions in a manner of the ratio type circuit, thus forming a characteristic aspect of this first embodiment. Here in the circuit 110, the output Z of the ratio type circuit serves as the input thereof.

The circuit 110 is called a clocked inverter. Thus, when signal $S_2=0$, the output thereof becomes a state of high impedance, that is a state of being shut off from a power supply. When $S_2=1$, the circuit 110 operates as an inverter. Now, the circuit 110 and an inverter 3 constitute a latch circuit 120 which sustains a value of node 1 when $S_2=1$. Utilizing the circuits such as 100 and 120, there is realized a technique in the following manner in order to shut off a d.c. current path while holding a logic value under a normal operation thereof.

Still referring to FIG. 3A, first of all, after a potential of the node 1 is determined and made stable, set $S_1=1$, and detach the node 1 from the power supply (potential VDD) so as to be in the state of high impedance. On the other hand, after setting $S_2=1$, a logic value of the node 2 is stored in the latch circuit 120. The latch circuit 120 is a feedback loop circuit which comprises the clocked inverter 110 and the inverter 3. The signal $S_1$ and the signal $S_2$ may be changed prior to other, regardless of which is first changed. Further, of course the signals may be changed simultaneously. Alternatively, such the signals may be grouped as one signal. Now, care shall be taken to a case where signal $S_2$ is changed after signal $S_1$. In that case, signal $S_2$ need be changed prior to changement of the logic value of node 1 viewed from the inverter 3 after the node 1 became a high impedance state by signal $S_1$.

As described above, by setting both $S_1$ and $S_2$ at 1 ($S_1=S_2=1$) the logic value of node 1 under the normal operation can be stored in the latch circuit 120. Then, the feedback loop circuit (comprising 110 and 3) finally becomes the stable state when the both node 1 and the output node Z become equal to the potential of the power supply (VDD or VSS). Therefore, after an appropriate time lapses, the potential of node 1 becomes equal to the power supply. Therefore, in this stable state, the d.c. current path is completely shut off under condition where the logic value of node 1 under the normal operation is stored in the circuit 120. Consequently, there is executed a desirous standby current test still utilizing the output which occurs at the time of normal operation of the ratio type circuit.

Embodiment No. 2 (precharged type circuit)

Figure 3B:
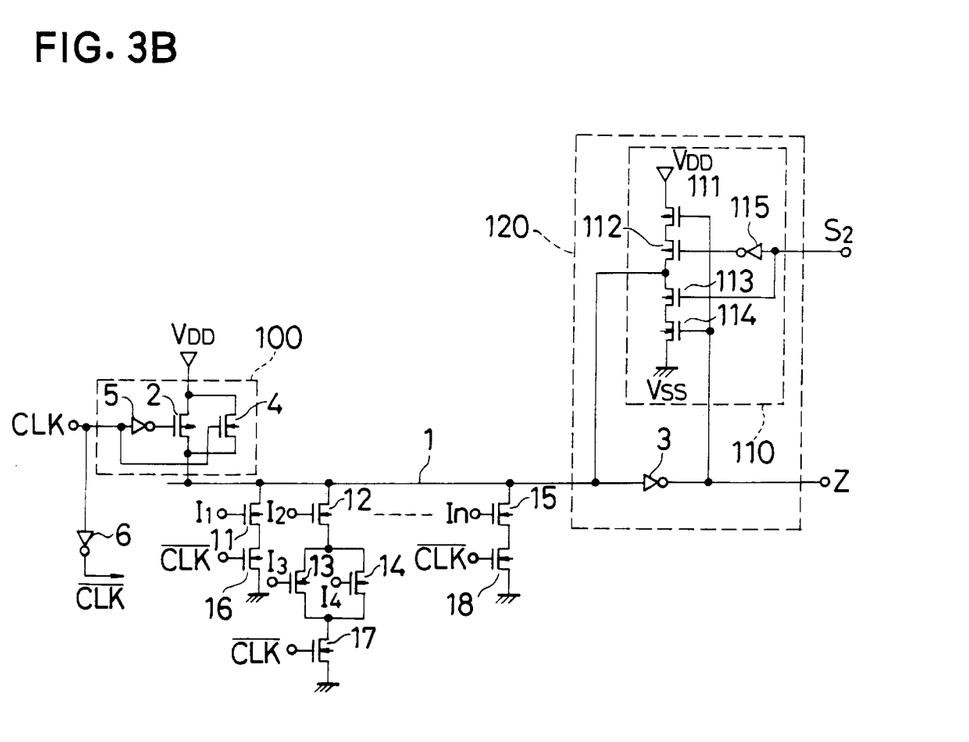
FIG. 3B is a precharged type circuit according to the second embodiment of the present invention.

Referring to FIG. 3B, there is shown the present invention according to the second embodiment adapted for a precharged type circuit.

Node 1 is precharged up to the potential VDD during the clock signal $\overline{CLK}=1$ through a similar circuit shown in FIG. 9B. Utilizing such a duration, a standby current test is possible for a precharged type circuit whose output is fixed, as described in the Description of the Prior Arts. On the other hand, during signal $\overline{CLK}=0$ where output $Z=I_1+I_2\cdot(I_3+I_4)+\ldots+I_n$ takes an appropriate logic value in response to inputs $I_1, I_2, \ldots, I_n$, disconnected is a connection between the node 1 and he circuit which supplies the electric charge from the power supply. Therefore, by certain combination among inputs $I_1$ through $I_n$, the node 1 may become a state of high impedance (this is corresponded to the logic 1). However, this is not an expected desirable stable state so that the potential of node 1 gradually diminishes from VDD, and the d.c. current may flow through.

In view of such the drawback as described above, in this second embodiment there is provided, in a similar manner with the first embodiment, a latch circuit 120 is attached to the conventional circuit. The latch circuit 120 of FIG. 3B is controlled by the signal $S_2$ and includes an inverter 3 which supplies an output Z where node 1 serves as an output. In the latch circuit 120, after signal $\overline{CLK}$ changes from 1 to 0 and thus the output Z is determined, the signal $S_2$ is changed from 0 to 1 and a logic value of node 1 is held at a same potential (VDD or VSS) of the power supply.

Therefore, the standby current test can be performed utilizing output Z of a precharged type circuit determined by the corresponding inputs $I_1$ through $I_n$, during the clock signal $\overline{CLK}$=0 under the normal operation. Now, in this second embodiment, an inverse of the clock signal CLK serves as the signal S1 described in the first embodiment.

Figure 4A:
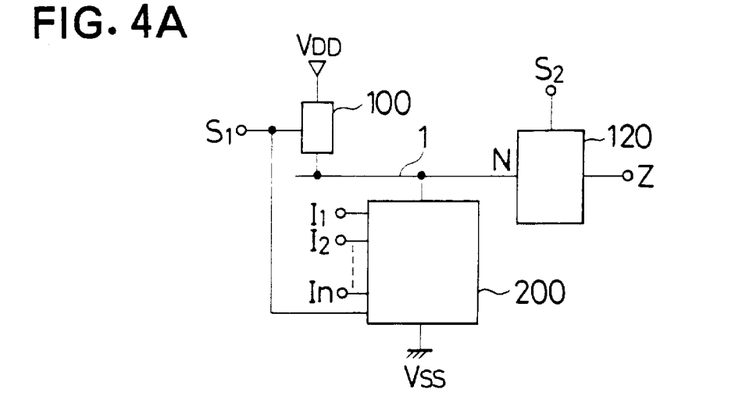
FIG. 4A and FIG. 4B are block diagrams showing the first and second embodiments in a more general form.
Figure 4B:
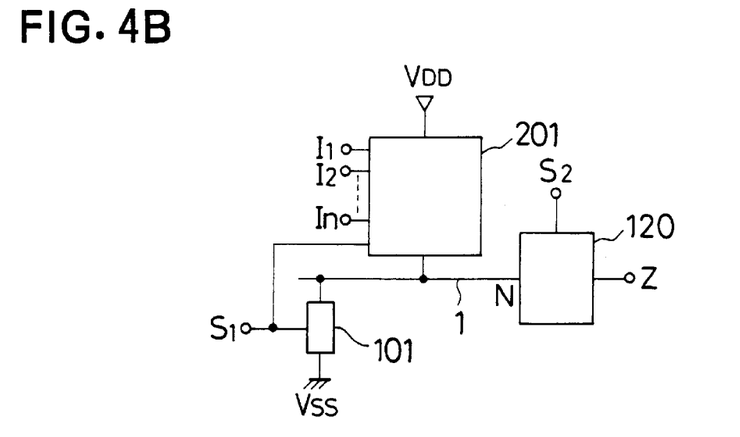

FIG. 4A and FIG. 4B are block diagrams showing the first and second embodiments in a more general form.

Referring to FIG. 4A, there is shown a ratio type or precharged type circuit in which the electric current or electric charge is supplied from a high potential side (VDD) of the power supply through circuit 100 to node 1.

In FIG. 4A, block 200 is a circuit block in which a logic function appearing as output Z responsive to inputs $I_1$ through $I_2$ under the normal operation is implemented mainly by an NMOS element. As described before, there can be various configurations possible to realize the circuit 100. Block 200 includes signal $S_1$. The signal $S_1$ is utilized for the current not to flow through during the precharge. However, the signal $S_1$ to the block 200 will not be necessitated in the ratio type circuit.

Circuit 100 is switched OFF by signal $S_1$, and the logic value of node 1 which operates in a ratio manner or precharged is stored at a same level with the power supply by signal $S_2$, so that the standby current test can be performed under the same input/output condition as the normal operation time.

Referring to FIG. 4B, there is shown a ratio type or precharged type circuit in which the electric current or electric charge is discharged to a low potential (VSS) side of the power supply through circuit 101 from node 1 by signal $S_1$.

In FIG. 4B, block 201 is circuit block in which the logic function appearing as output Z responsive to input $I_1$ through $I_n$ under the normal operation is implemented and in which there is manly constituted by PMOS elements. As a basic element for circuit 101, there is considered an NMOS element. In this case, when signal S1 is defined that node 1 is disconnected from the power supply at signal S1=1, an inverse signal of signal S1 need be as a gate input. Depending on the use therefor, there may also be utilized a PMOS element. The reason why signal $S_1$ is also included as an input in block 201 is same as described in FIG. 4A.

Figure 4C:
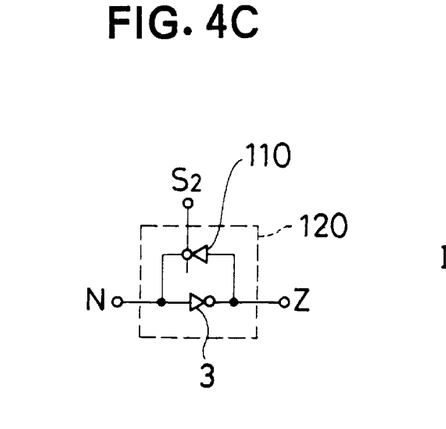
FIG. 4C is a circuit diagram showing the latch circuit 120 shown in FIG. 4B.
Figure 4D:
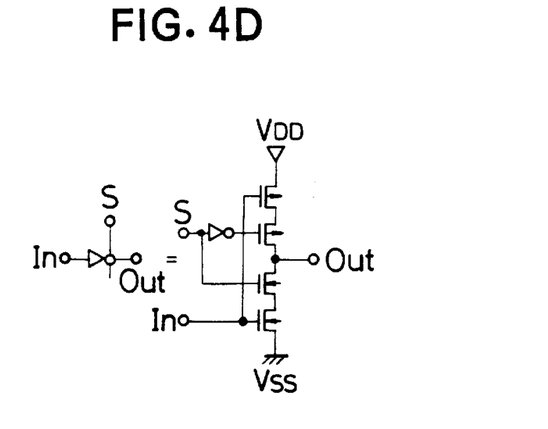
FIG. 4D is a circuit diagram showing the clocked inverter circuit 110 shown in FIG. 4C.

Still referring to FIG. 4A or 4B, the latch circuit 120 having terminal S2, node N and output Z is configured therein as shown in FIG. 4C. Moreover, a clocked inverter 110 shown in FIG. 4C is configured as shown in FIG. 4D.

Embodiment No. 3

Figure 5:
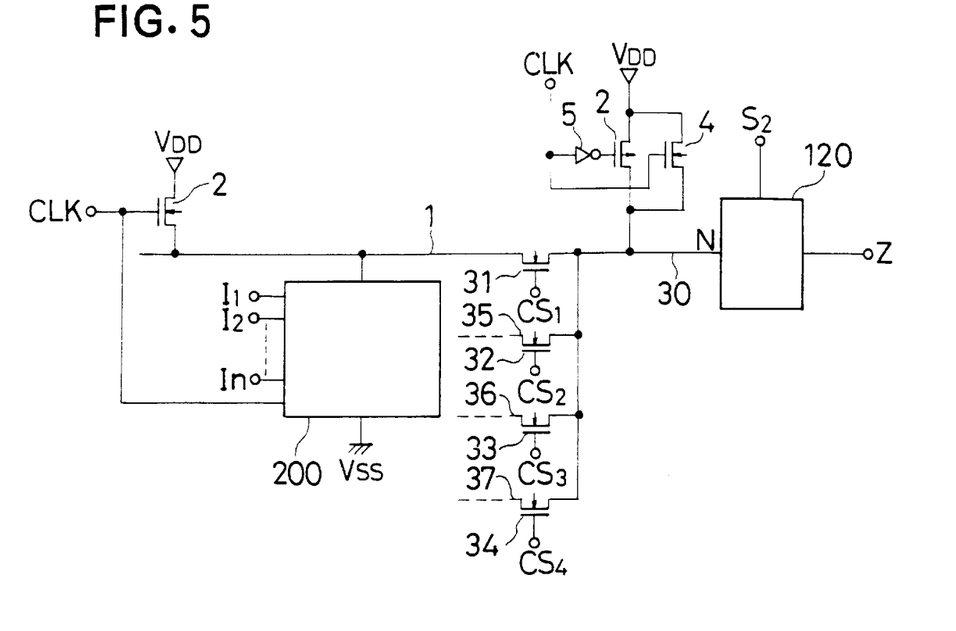
FIG. 5 is a circuit configuration showing the third embodiment in which there are provided a plurality of nodes (nodes 30, 1, 35, 36 and 37) which operate in a manner of the precharge type.

FIG. 5 is a circuit configuration showing the third embodiment in which there are provided a plurality of nodes (nodes 30, 1, 35, 36 and 37) which operate in a manner of the precharge type.

Referring to FIG. 5, nodes 1, 35, 36 and 37 are connected to node 30 through NMOS elements 31, 32, 33 and 34. In the same figure there is shown a circuit connected to the node 1; the same sort of circuit connected to the node 1 is also connected to the node 35, 36 and 37, respectively in the similar manner. Node 30 is connected to the output Z through the latch circuit 120. NMOS elements 31, 32, 33, 34 are switched ON/OFF by means of signals CS1, CS2, CS3, CS4, respectively. Under the normal operation, only a single signal among these signals CS1 through CS4 becomes "1". Therefore, the circuit shown in FIG. 5 is constructed so that only a single NMOS element among NMOS elements 31 through 34 becomes a ON state. In this example, it is assumed that, CS1=0, and node 30 is connected to node 1.

Figure 6A:
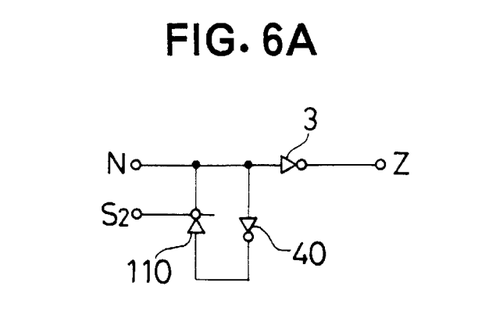
FIGS. 6A, 6B and 6C are circuit diagrams according to other embodiments (fouth embodiment).

In a circuit shown in FIG. 5, during clock signal CLK=1, the precharging is executed. During such precharging execution, the potential of precharged node 1, 35, 36, 37 is set at (VDD−Vth,n) where Vth,n denotes a threshold voltage of an NMOS element. As a result thereof, power consumption of the circuit can be substantially reduced. On the other hand, the potential of precharged node 30 is set at VDD, so that there can be secured a voltage margin regarding a logic 1 input toward an output inverter 3 (which exists inside the latch circuit 120 and is shown in FIG. 6A) under the normal operation.

For example, as a circuit which can be considered equivalent to the circuit shown in FIG. 5, there is a precharged type ROM (read only memory). In the case of the precharged type ROM, NMOS elements 31 through 34 shown in FIG. 5 correspond to a column selector; in the same sense, nodes 1, 35, 36, 37 correspond to a bit line, inputs $I_1$ through $I_n$ correspond to word line, for instance. In the third embodiment, as similar to the previous embodiments, there is added the latch circuit 120 which serves to latch data of a node (node 30 in case found in FIG. 5) which is connected to terminal N by signal $S_2$, so that after determined is the output Z in response to inputs $I_1$ through $I_2$ when clock signal CLK changes from 1 to 0, the signal $S_2$ is changed from 0 to 1 and the logic value of node 30 is held and stored at a same potential (VDD or VSS) with the power supply.

Therefore, the standby current test can be executed utilizing output Z of a precharged type circuit determined by the corresponding inputs $I_1$ through $I_n$, during the clock signal CLK=0 under the normal operation. Then, the potential of nodes 35, 36, 37 may be in an intermediate range between VDD and VSS. However, such the nodes are not capable of being an effective gate to other gates, thus not being effective in a detrimental sense. In the third embodiment, an inversed signal of clock signal CLK serves as the signal $S_1$ described in the first embodiment.

Embodiment No. 4

Figure 6B:
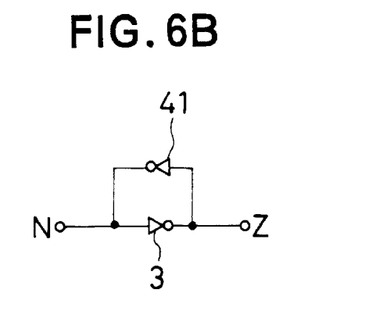
Figure 6C:
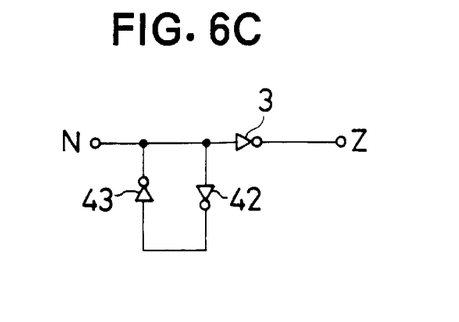

FIGS. 6A, 6B and 6C are circuit diagrams according to the fourth embodiment in which there is shown another circuit configuration implemented for the latch circuit 120.

In particular, referring to FIG. 6B, there is simply used a feedback loop inverter 41 for output Z, instead of the clocked inverter. In this case, there is an advantageous aspect where the signal $S_2$ can be eliminated. On the other hand, the feedback inverter 41 always drives its own output; as a result, when the logic value of node 1 changes, the feedback inverter 41 serves to interfere the change thereof until the output Z of the inverter 3 changes to cross the logic threshold voltage. Thus, the size of inverter 41 need be constructed by as small as possible. At any rate, deterioration of the operation speed thereof is somehow unavoidable to a certain degree. In this connection, when implementing as such, a care must be taken, for example, by taking a in-detail prepared simulation therefor and the like. Referring to FIG. 6C, the circuit shown in FIG. 6C also has an advantage whereby signal $S_2$ is not necessary. However, the feedback inverter 43 in FIG. 6C has implicitly an operation by which the normal operation from node N to output Z through inverter 3 is made rather slow, so that a care shall be taken when really implementing it.

It shall be appreciated that in all the embodiments described in this application the scope of the present invention includes any possible alterations such as in polarities of all signals or circuit configuration.

As has been described so far, in previously mentioned semiconductor integrated circuits, the output node of the ratio type or precharged type circuits are shut off from the power supply as a source or drain of current or electric charge and maintained in the same logic value as in the normal operation so as to be definitely stored at the same potential (VDD or VSS) as the power supply, so that the d.c.

current path is eliminated in the ratio type and precharged type circuits which exist mixedly in the LSI circuit mainly comprising the CMOS circuits. Thereby, the same standby current test can be executed as if the LSI circuit comprises purely CMOS circuits. Moreover, by implementing the present invention, deficiency accompanied by the slight increase of the leak current can be detected. At this point, the present invention is much more advantageous than a test which judges "passed" or "failed" by means of logic values of outputs from a circuit to be tested, based on, for example, the single stuck-at fault mode, which can hardly detect the slight increase of the leak current.

Embodiment No. 5

Now there can be an aspect to be furthermore improved so as to further optimize the present invention. In other words, notice that, in general LSI's, there exist macro blocks that are regularly configured therein and are composed of a plurality of (for example, some hundreds trough a thousand) nodes operating in a manner of the ratio or precharge type. If the above-mentioned embodiments are to be implemented to such the LSI's, there is concern that such added circuits may be undesirously increased in area thereof occupied so that a cost for producing such an LSI chip may be accompanied thereby and be increased also.

Thus, for a regularly constructed circuit block where integrated therein are the plurality of nodes operating in the manner of the ratio type or precharge type, there is adopted a regularly constructed test circuit to each of the plural nodes. As a result thereof, a relatively small amount of combination of the standby states enables to almost completely detect leaky deficiency which is required to be duly detected at a test stage. In order to achieve such configuration, there is employed an exclusive-use (leak detection) circuit which realizes these plural standby states with a rather simple circuitry so that the standby current test is easily executed without causing the test circuit implemented to be undesirously bulky in size thereof.

Figure 7:
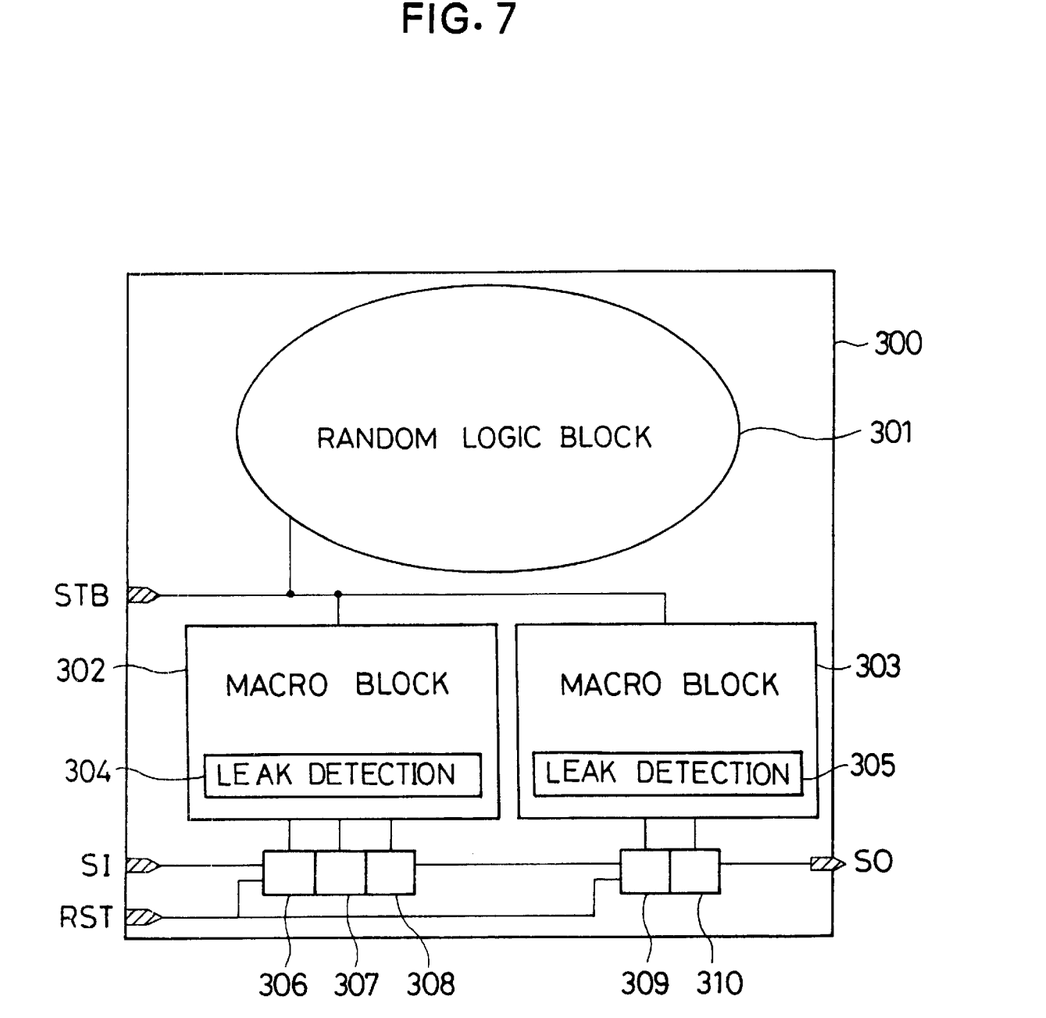
FIG. 7 is a block diagram to describe a basic concept and configuration therefor according to the fifth embodiment.

Referring to FIG. 7, there is shown a diagram to describe a basic concept and configuration therefor according to the fifth embodiment. In the same figure, an LSI 300 comprises a random logic block 301, and macro blocks 302, 303 including a core portion which is integrated by a plurality of nodes (some tens through a thousand of nodes, for example) operating in the manner of ratio or precharge type. The macro blocks 302, 303 may be regards as a ROM, RAM, PLA or the like which are of regular construction. The random logic block 301 includes also circuits constructed by a relatively small (one to some tens, for example) amount of nodes operating in the manner of the ratio or precharge type. It shall be appreciated that, in a case of the macro blocks which includes ten or less nodes operating in the ratio or precharged manner, such the macro blocks may be included into the random logic block 301 depending on conditions for ease of design, amount of added circuits and test quality and so on.

In FIG. 7, omitted are signals between above blocks 301, 302, 303, and the outside of the LSI 300 via terminals which are not essetial to the present invention. It shall be pointed out that whole or majority of the output signals of the macro blocks 302, 303 are assumed to be supplied to outside through registers which temporarily store these signals. For example, these registers are made operable for scanning so that an arbitrary input data can be supplied to an inner circuit of the random logic block 301 which takes inputs from the registers. On the other hand, there may be a case where outputs of the macro blocks 302, 303 are not temporarily stored in the registers and are directly inputted to the random logic block 301, instead. In this case, the fifth embodiment can not directly be utilized therefor, and it is necessary, for example, that the output signals of the macro blocks 302, 303, are each multiplexed with an output of a scannable flip-flop and under standby current testing, the latter output are made available to outside. Apart from the above, in order to completely detect leak-increasing deficiency in the core portion, there are incorporated exclusive-use (or leak detection) circuits 304, 305 which serve to a second standby setting means for enabling to cause a plurality of standby states.

Next, realization as to the standby state for the LSI chip 300 will be described as follows.

First of all, there is supplied a standby state setting signal STB from an external portion. Assume that STB=1 means the standby state. The signal STB operates to the random logic block 301 in a similar manner described in the previous embodiments that circuits are switched OFF which supply the electric charge from the power source in the circuits whose inner nodes operate in the ratio or precharged manner. Then, the logic value of the nodes is kept at the same potential as the power supply (VDD or VSS) when the signal STB is becomes effective (the STB changes from 0 to 1.

On the other hand, in the macro blocks 302, 303 mainly toward the core portion thereof, there are provided exclusive-use circuits 304, 305 for detecting the leakage-increasing deficiency. Operation of the exclusive-use circuits 304, 305 are controlled by signal STB, outputs of flip-flops (F/F) 306, 307, 308 (which are connected to macro block 302) and flip-flops 309, 310 (referred to as F/F hereinafter) (which are connected to the macro block 303). The F/F's constitute scan chain where SI and SO serve respectively a scan-in terminal and a scan-out terminal. Thereby, an appropriate test mode (not shown), like serial in a scan operation mode distinguished from the a normal operation mode, enables to write and read F/F's. Moreover, the F/F's are reset by a resetting signal RST which is used for initialization in the normal operation, where the resetting is performed when RST=1. As a consequence, a content for F/F's is not changed under the normal operation mode. Under a state of being reset, the macro blocks 302, 303 are configured so as to operate normally.

In the course of setting macro blocks 302, 303 at a standby state, there are also utilized circuits, such as input registers for respective macro blocks, which are originally equipped therewith for the normal operation, in order to minimize an increase due to the newly added circuits. However, as the above mentioned F/F's, there are only included such F/F's which are indispensable in setting the standby state where use of the normal circuits alone would not be render the test possible. Specifically, as for setting the macro blocks 302, 303 at the state of standby, first of all, a necessary specific initial data required for realizing the standby state is set to the above mentioned F/F's, input registers and output registers by utilizing the scan operation mode. Thereafter, signal STB is changed to 1 from 0, so that realized is the standby state according to inner portions of the macro blocks 302, 303 and the output value of the macro blocks stored in the ouytput register.

The standby current test for LSI 300 is executed in the following sequence.

(1) After signal RST becomes 1 (RST=1), the whole chip 300 is initialized, then the chip 300 is shifted to the normal operation mode. In that condition, there is a timing when an output data is determined under an appropriate input data. Then, at that timing, signal STB can be changed to 1 from 0 so that a power supply current is measured. Taking the similar step of the above procedure for a plurality of input data, almost every leakage-increasing deficiency in the inner portion of the random logic block 301 can be detected. In macro blocks 302, 303, there is executed the current test at the standby state realized within respective macro blocks according to the scan F/F's 306, 307, 308 and 309, 310 being set to a state of reset.

(2) In order to obtain the standby state required to detect leakage-increasing deficiencies mainly of the core potion against macro blocks 302, 303, the initial data is set to scan F/F's (which control the circuit including leak detection circuits 304, 305) and the normally operated circuits under a scan operation mode. Thereafter, signal STB is changed to 1 from 0 so as to measure the power supply current.

By taking steps (1) and (2), there can be possible the faint leak current test which thoroughly detects the leak-increasing deficiency found within LSI 300. As for input data for testing use in above test (1), there can be obtained substantially improved effectiveness over the conventional practice even when test vectors to be used are properly selected from these for functional verification so that an improved gate activation rate can be obtained thereby. However, if it is desired to have further perfected test vectors, such test vectors are preferably generated with a aid of a CAT (Computer Aided Testing) tool.

Attention may be directed to the fact that the input data for testing use in above step (2) is generated manually, however, the number of vectors necessary therefor is rather small, thus not causing any problem.

It shall be appreciated that in step (1) there may be taken a sequence of the steps comprising:

inputting data by a scan operation mode (→ normal operation)→ setting the standby state (setting signal STB to 1 from 0) and measuring the supply current, instead of the steps comprising of reset→ normal operation→ setting the standby state (setting signal STB to 1 from 0) and measuring the supply current. The method described above enables the CAT tool easier to handle. Further, note that in this case, there is a need where data, by which the resetting state is obtained, shall be set in the scan F/F's 306, 307, 308 and 309, 310.

In the above steps (1) and (2), classification of the leakage-increasing deficiencies is possible to a certain degree. For instance, in a case where constantly observed is the leak current which is beyond a tolerance thereof, there can be considered with a strong possibility that a level of the leak current between a drain and a substrate of transistors in the LSI chip is abnormally high as a whole due to a trouble in a process of making the LSI chip; this strong possibility would be more definite by measuring a temperature dependency thereof. On the other hand, in a case where an order of current value measured varies depending on the input data, there can be considered with a strong possibility that the deficiency such as a bridge deficiency may be in presence, in random logic 301 or macro blocks 302, 303, which increases the leak current.

However, attention shall be directed to an intrinsic nature of the standby current test itself. The presence of deficiency is detected, if any, by only one parameter that is a change in the supply current. Moreover, the standby current test is primarily intended to detect a deficiency which does not appear as a logical malfunction. Therefore, though the standby current test can clearly detect the presence of the deficiency, the standby current test is not absolutely highly capable for analyzing where the deficiency is located, and in particular, the test may accompany a difficulty as to where exactly the defect exists. However, such a drawback may not be so problematic at all in terms of advantageous aspects where the deficiency prior to the emergence as the logical malfunction is detected so that such the defect can be eliminated as a defective chips and thus highly reliable LSI chips shall be delivered to customers.

Moreover, when executing the above step (1), it may be possible to combine the STB signal and the output of the scan F/F's that is used to set the standby state for macro blocks 302, 303 so that such the combined signal becomes invalid against each macro block at the time of normal operation, instead of using the resetting signal RST. Moreover, it is of course possible to have a configuration such that the standby state can be directly set from an external portion through input pins of the LSI chip, without using the scan F/F's.

Embodiment No. 6

Next, a specific example for macro blocks 302, 303 will be described below.

Figure 8:
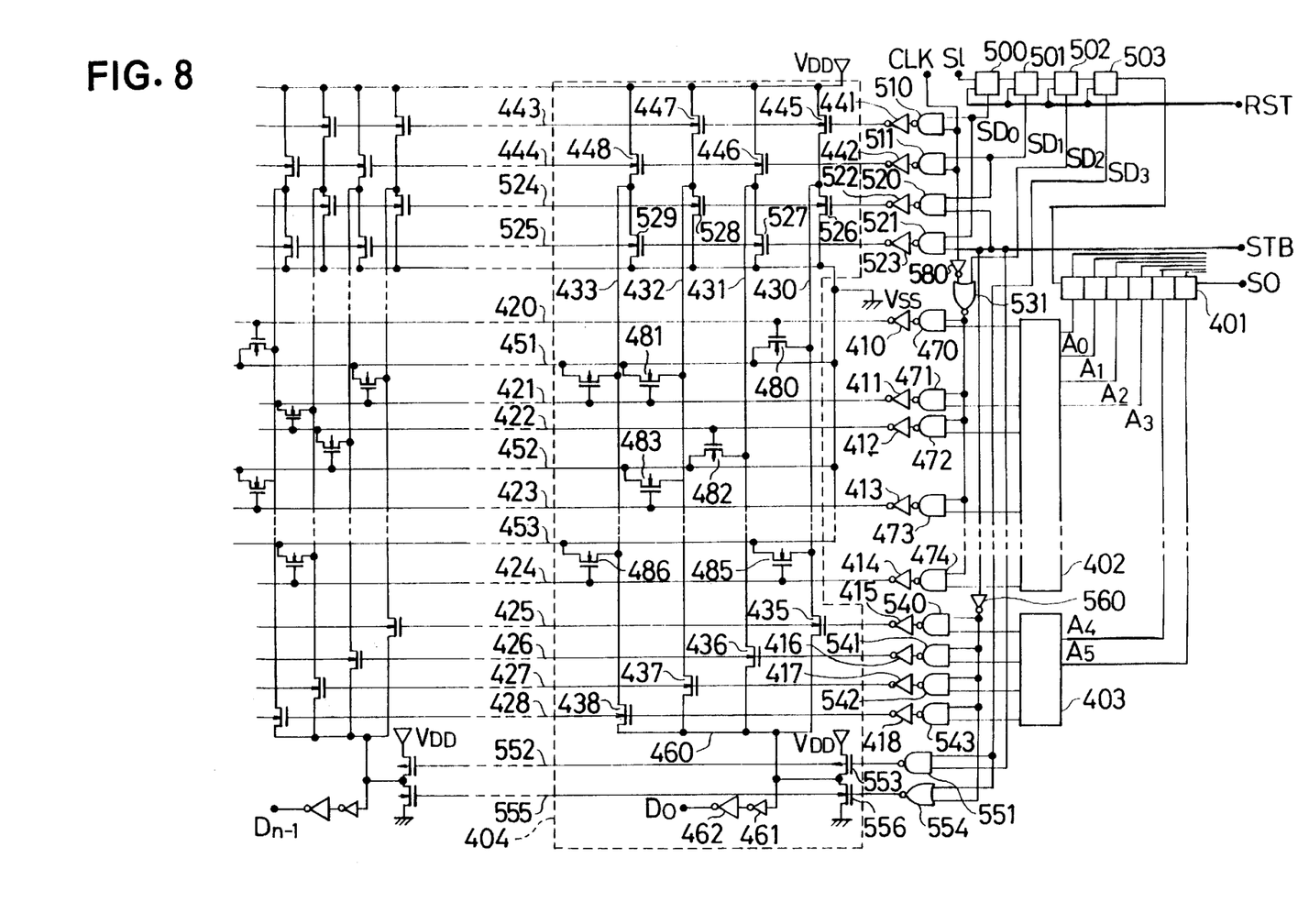
FIG. 8 is a circuit diagram showing the sixth embodiment where there is configured a precharge-type NOR circuit (n bit×64 words) having a built-in exclusive-use circuit therein.

FIG. 8 is a circuit diagram showing the sixth embodiment where there is configured a precharged-type NOR ROM circuit (n bit×64 words) having a built-in exclusive-use (leak detection) circuit therein.

In FIG. 8, omitted is a simple portion which appears repeatedly, and omitted also is numbering on portions which are not indispensable in the present invention. An indispensable circuit for the present invention here are a peripheral circuit portion and a portion related to 1-bit output of a ROM's core portion related within dotted line 404. In the same figure, members having reference numbers in 400 level are circuits or elements already required for ROM operation (that is the normal operation). On the other hand, members having reference numbers in 500 level are the circuits or elements required for this present invention.

First of all, described as follows is a configuration of the ROM for the normal operation.

Referring to FIG. 8, an address given by A0 through A5 (where A0 is the most significant address bit among the address bits) are supplied from an external source through address register 401. Significant 4-bits A0, A1, A2, A3 are decoded by row decoder 402 so as to become inputs for word line drivers 410 through 414 to drive word lines 420 through 424. Leasts significant 2-bits A4, A5 of an adddress are decoded by column decoder 403 so as to become inputs for column selection line drivers 415 through 418 by which column selection lines 425 through 428. The outputs of both row and column decoders are highly active so that the output corresponding to the selected address is 1 (that is potential VDD) whereas the rest are 0 (where the potential thereof is VSS).

Column selectors 435 through 438 are on-off controlled by column selection lines 425 through 428. The column selectors 435 through 438 select one among four bit lines 430 through 433, in accordance with an output of the column decoder 403, and then transfer an output thereof to 1-bit output node 460 of the ROM (where the out put of the ROM is such that it is not driven to outside yet). An output of the node 460 is driven by inverters 461, 462 so as to become output $D_0$ of the ROM. Outputs $D_0$ through $D_{n-1}$ are stored in an output register which is not shown in FIG. 8.

Next, a basic operation of the ROM will be described as follows.

When clock signal CLK equals to 1 (CLK=1), in the precharging operation of bit lines (430 through 433), NMOS element activation lines 443, 444 are set to logic 1 by NMOS element activation line drivers 441, 442 which is used for precharging (now, let the other input than the signal CLK of NAND gates 510, 511 bwe logic 1), so that NMOS elements 445 through 448 becomes the state of ON. Notice here that though precharging is possible at a high speed, precharging can only be executed up to a level of (VDD−Vth,n) where Vth,n designates a threshold of the NMOS element. Therefore, there may be a case where the precharging is executed up to the level of VDD by implementing a PMOS in an output side of the ROM. However, in the following description, assume that there is no such the PMOS implemented for the sake of ease in explanation therefor. Innerdata of the inner ROM is read out during signal CLK=0. As for ROM data, by implementing NMOS elements 480 through 486 in a position where a bit liner corresponding to the column at which an output becomes 1 intersects with a word line at which an output becomes 1, the NMOS elements become a state of ON and the bit line is discharged to render the logic to be 0, so that the output of the bit of the ROM becomes 0. On the other hand, when the NMOS elements are absent from being implemented in the above location, the discharging of the bit line does not occur, thus the output becoming 1. In other words, as the ROM data, the logic is 0 if there is an NMOS element on a site where the word line and the bit line intersects to each other, while the logic is 1 when there is no such an NMOS element as such.

In the ROM, in order to avoid the d.c. current from flowing through the NMOS element corresponding to the ROM data of 0 during precharge (CLK=1), the respective outputs of row decoder 402 and the signal CLK are input to the 2-input NAND gates 470 through 474 which are connected to world line drivers 410 through 414 which drive word lines 420 through 424. Thereby, every output of the word line is maintained at potential VSS during precharge. However, if there is required a high speedness therefor, the above configuration will not be necessary.

Next, there will be described below exclusive-use circuits which are implemented for detecting important leakage-increasing deficiencies in the core portion of the ROM.

Exclusive-use circuits 304, 305 are named as leak detection circuits 304, 305 in FIG. 7 for better understanding for a functional aspect thereof. However, in this application the both terms are interchangeably used.

As mentioned above with reference to FIG. 8, the exclusive-use circuits are constituted by the circuits or elements having the reference numbers in the level of 500 in FIG. 8. In the core portion of the ROM, there are provided scan F/F's 500 through 503 which are basic circuits for setting the standby state that is required for realizing to detect the important leakage-increasing deficiencies. The scan F/F's (500 through 503) can be reset by signal RST. The scan F/F's output signals $SD_0$ through $SD_3$, respectively. In order to economize a hardware therefor, in the case of the ROM, there will be needed a setting of contents for address register 401 (which is used under the normal operation) so that a complete standby state can be set up.

Scan F/F's (500 through 503) and address register 401 have a scan-in terminal and a scan-out terminal, so as to constitute a scan chain. Thereby, an arbitrary value can be set up under a scan operation mode. After the scan F/F's (500–503) are reset, the state of being reset is maintained under the normal operation, so as to enable the normal operation of the ROM. In the course of setting the standby state for the ROM, combination of $SD_0$ and $SD_1$ is involved in the state of bit lines, whereas $SD_2$ is involved in setting the state of world lines, and $SD_3$ in setting the state of undrived output node 460 of the ROM.

The following shows an example of how to execute the standby current test on the ROM.

First, necessary data for setting the standby state is transferred, in advance, to four scan F/F's (500–503) which serve to set up the standby state and address register 401. Thereafter, clock signal CLK being maintained at 1, after signal STB is changed from 0 to 1, the supply current is measured. The above procedures are repeated for a predetermined data which is used for settings the standby state. Therefore, there will be somehow necessitated a small circuit which takes input signal CLK and signal STB as inputs. Moreover, as for the bit line, there is implemented a circuit for discharging these, such as NAND gates 520, 521, drivers 522, 523, NMOS element activation lines 524, 525 and NMOS elements 526 trhough 529 to be used for discharging the bit lines.

Caution shall be taken in regard to the standby state setting circuit for the ROM, as follows:

In this ROM, in light of the fact that the standby state can be rather easily set up if the column selector is utilized as an electrical boundary, output 1 from column decoder 403 is made invalid, that is to say, made 0 by NAND gates (540 through 543), one of those inputs is signal STB, and column selection line drivers 415 through 418 when signal STB=1. In other words, all of column selection lines 425–428 become potential VSS, and all of column selectors 435–438 become OFF, so that bit lines 430–433 and the ROM's undrived output node 460 are electrically separated. Moreover, in this case, since the ROM's unrived output node 460 becomes a floating state, it is arranged that node 460 is maintained at potential VDD (when $SD_3=1$) or potential VSS (when $SD_3=0$) when STB=1.

Next, the following are listing of the major important leakage-increasing defects to be considered in the core portion of the ROM shown in FIG. 8.

Bridge defects in between signal lines:

[1] between adjacent bit lines

[2] between adjacent word lines

[3] between word line and bit line

Bridge defects in between signal lines and between supply line:

[4] between bit line and VSS line

[5] word line and VSS line

Week ON defect of element:

[6] between drain and gate of NMOS element on each site of ROM's core portion

[7] between gate and source of NMOS element on each site of ROM's core portion

[8] between drain and source of NMOS element on each site of ROM's core portion

[9] between drain and gate of column selector's NMOS element

[10] between gate and source of column selector's NMOS element

[11] between drain and source of column selector's NMOS element

In the above, as for bridge defects found in between adjacent column selection lines, the number of the lines are small, and a line interval therebetween is longer than that of bit line or word line, so that such defects are considered negligible. Moreover, there is no substantial need for considering the bridge defects in between the signal line and the VDD line since they are not intersected to each other (in the layout). Of course, it is possible to implement an exclusive-use circuit (leak detection circuit) for detecting defects between such lines, though.

Now, a defect represented in above [1] is detected such that adjacent bit lines have different logic value to each other. However, such detection can not be realized during the precharge period with signal CLK=1 that defines the standby state. Thus, there is implemented an circuit such that the bit lines thereof have alternately different logic values. Namely, suppose $SD_0=1$ and $SD_1=0$ with CLK=1 and STB= 1, bit lines 430, 432 are forcibly set to potential VDD and bit lines 431, 433 are forcibly set to potential VSS, while with $SD_0=0$ and $SD_1=1$, the results thereof will be opposite thereto. Now, then, in order not to form the d.c. current path, potentials for all word lines must be potential VSS. Therefore, SD2 must be 0 ($SD_2=2$).

Defect [2], similar to [1], can be detected such that adjacent word lines have different logic values to each other alternately. This detection of [2] can be realized with $SD_2=1$. Under this condition of $SD_2=1$, upper significant 4 bits of the addresses ($A_0$ through $A_3$) are changed in data thereof. However, since potential of all bit lines shall be VSS, it is necessary that CLK=0 and $SD_0=SD_1=1$.

The defect of [3] can be detected during the course of executing [1] or [2]. The defect of [4] can be detected with test [1] if the potential of the bit line differs from VSS. However, it is preferred to set all bit line potentials to VDD (CLK=1 and $SD_0=0$ and $SD_1=0$) so as to be differentiated from test [1]. As shown in FIG. 8, the defect of [5] can be detected during the execution of [2]. The defect of [5] can be differentiated from that of [2] base on the standby current in which an abnormal current is detected. The defect [6] is equivalent to [3]. The defect of [7] is equivalent to [5].

Every element becomes OFF during precharging operation of the bit lines. The defect [8] can be detected when the standby current test is carried out for all bit lines under such a state. In other words, $SD_0$, $SD_1$ and $SD_2$ shall be set to 0 ($SD_0=0$, $SD_1=0$ and $SD_2=0$). The defects [9] through [11] can be detected such that the potential of the bit line is set to VSS against $SD_3=1$ (where the potential of node 460 is VDD) and is set in a opposite way when $SD_3=0$.

Embodiment. No. 7

Figures 10, 11:
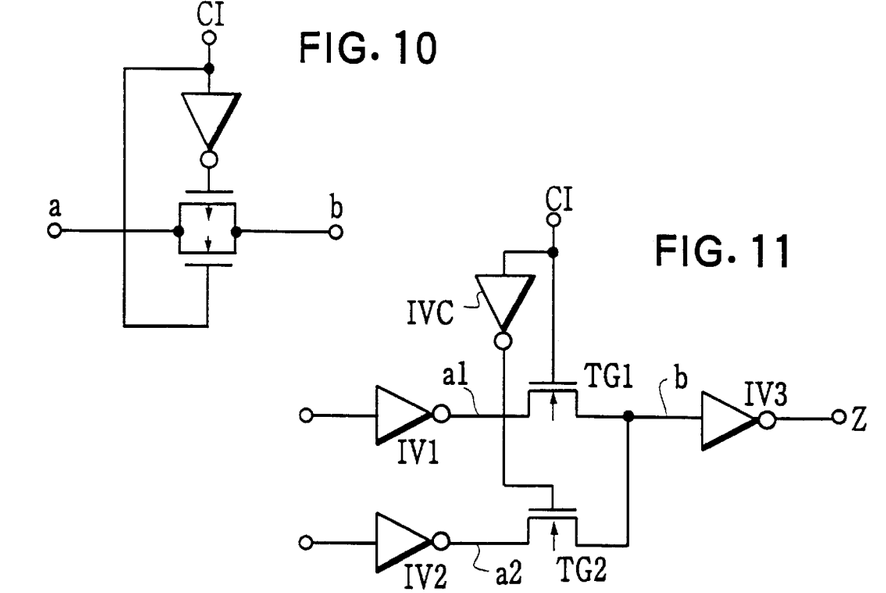

In other cases than those ratio type or precharged type nodes described so far, there exists, within LSI's basically comprised of the CMOS circuits, a node which generates the d.c. current that may hinder the standby current test under even a static state with an input/output determined. There is needed a necessary process to realize an effective standby current test under such a situation described above. FIG. 11 shows such a trouble some node. With reference to FIG. 11, there exists output node b of a selector which comprises transmission gates TG1, TG2 including NMOS elements alone. The transmission gates TG1, TG2 serve to render an input side and an output side conductive or nonconductive. For example, with reference to FIG. 11, a value of node a1 is selected when control input CI equals to 1 (CI=1), whereas a value of node a2 is selected when CI=0. In other words, either of nodes (a1 or a2) is selected without fail. The input/output of node a1 or node a2 is determined by the fact that inverters IV1, IV2 drive node a1 or a2. The transmission gate is basically a bi-directional circuit. In other words, when an output of the drive inverter is connected to node b, most probably, node b becomes an input node of the transmission gate while nodes a1, a2 become output nodes of the gate. For those bi-directional circuits, the present invention is basically applicable if the transmission gate is regarded as a single direction circuit so that omitted here is a case of the standby current test used for the bi-directional circuit. Now, in CMOS circuits where PMOS elements and NMOS elements are combined in a complementary manner, the transmission gate is configured as shown in FIG. 10. However, there mainly exists a problem where an area for elements is unwontedly increased since the great number of elements are necessary therefor. In view of such a problem, it is possible to realize the circuit by utilizing NMOS elements alone. In this connection, though it is also possible to constitute by a single PMOS element, the operational speed therefor is slower than that of NMOS elements. Therefore the CMOS circuit by a single PMOS circuit is not likely to be used.

Figures 12, 13:
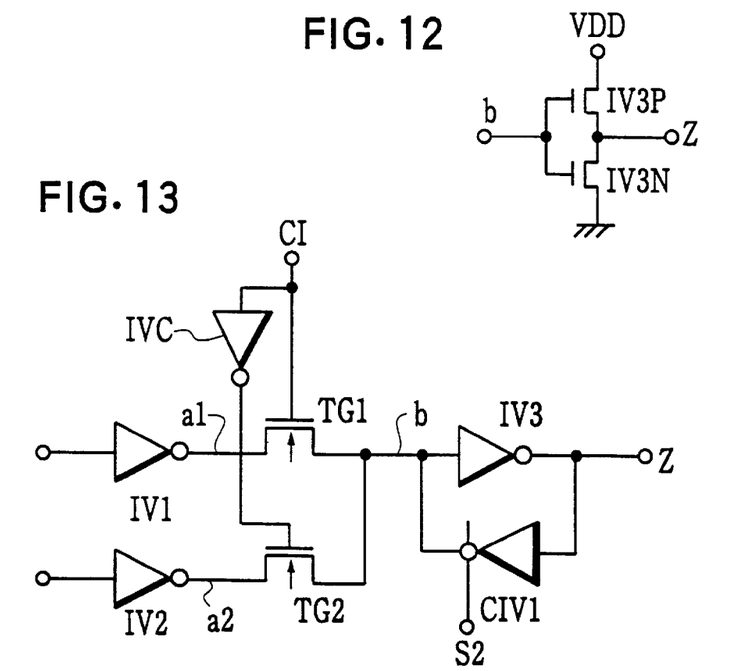
FIG. 12 shows a vairation for IV3 shown in FIG. 11.
FIG. 13 is a circuit configuration according to the seventh embodiment where there is provided a latch circuit therein so that the d.c. current will not flow through inverter IV3 so as to realize an optimum standby current test.

Still referring to FIGS. 10, 11, and 12 in terms of the operation of the transmission gates, nodes a1 and a2 of input side are driven by inverters IV1, IV2, respectively, so that logic values 0, 1 are corresponded to potential VSS, VDD, respectively. However, by way of NMOS element TG1 or TG2, output node b of input side shown in FIG. 12 representing inverter circuit IV3 of FIG. 11 becomes VSS and (VDD-Vth,n). Therefore, with reference to FIGS. 11 and 12, when the input to the LSI including this transmission gate is such that node a1 is logic 1 and control input CI is logic 1, both PMOS element IV3P and NMOS element IV3N (to which node b serves as a gate input) become weak ON state, thereby a great amount of d.c. current flowing. There exists the same sort of problem in case if a transmission gate by PMOS element. In these cases, the proper standby current test will not be executed. With reference to FIG. 13, such problems will be easily solved by adopting a circuit shown in FIG. 13. In other words, there is provided a latch circuit or the equilvalent so that a feedback loop is formed thereby with standby state setting signal $S_2$. The latch circuit may be comprised of inverter IV3 and clocked inverter CIV1, for example, as shown in FIG. 13. As a result, when signal $S_2$ is activated even though node b can not be driven up to potential VDD from node a1 or a2, the feedback loop is formed. Thereby, node b can be lifted up to potential VDD, so that the d.c. current will not flow through inverter IV3, thus realizing the standby current test.

In the afore-mentioned embodiments, there are added leak detection circuits 304, 305 for detecting the leakage-increasing deficiencies and there are realized a plurality of standby states, utilizing a relgular construction of the the ROM. Thereby, the leakage-oriented deficiency can be safely detected, so that a merely slight amount of increase accompanied by the added circuit achieves the optimal efficiency of the present inveniton.

Moreover, various configurations and methods therefor, such as polarity of signal and altered circuit configuration, are intended to be included in the appended scope of the claim.

As mentioned so far, by implementing the present invention, in the LSI circuit including a circuit mainly including CMOS devices in which nodes thereof operate in a ratio or precharged manner, the nodes are shut off from the power supply by means of the outside control signals under the same logic value as under the normal operation. Thereby, the circuit to be tested is maintained at the same potential with the power supply (VDD or VSS), thus realizing a reliable standby current test for any possible input values. This system and method therefor are effective for the circuit having a relatively small amount of nodes operating in the ratio or precharged manner.

In the LSI circuit block where a great many of nodes operated thus are integrated and a regularly construction thereof is presented, there is provided a leak detection circuit where a plurality of standby states are realized under the control signal in order to detect leakage deficiency that need be recognized as such. This system and method therefor are furhter effective than one described in the above paragraph in that this system can detect a micro spot of leakage that may not be found in the above method. In the instant invention's system and method for testing the circuit, the d.c. current path is prevented from occuring. The present invention is much more advantageous than a test which carries out the test by means of logic values of outputs from a circuit to be tested, based on the single stuck-at fault model.

In summary, according to the prensent invention, logic levels corresponding to all possible input signals are given to the output lines so as to realize the standby test, and the d.c. the current path of the circuit in question is so shutt off, under the same state of the normal operation, so as to carry out the leak current test. Thereby, measurement of the leak current under any possible state at a normal operation is possible. Threfore, there can be executed most reliable test to throughly detect leak current no matter how small it is and the defect caused thereby.

In other aspect of the present invention, the leak current is detected in a similar manner described just above in the circuit having a plurality of output lines arranged regularly. The detection is executed by utilizing such a regularly arranged configuration, and does accompany a necessity for a bulky added installment therefor, thus obtaining the above same effect.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for executing a standby current test for a semiconductor circuit, the method comprising the steps of:

(a) providing input test data to the semiconductor circuit in a normal operation mode;
   (b) providing a standby state setting signal in response to said step (a) to the semiconductor circuit for putting the semiconductor circuit in a standby mode;
   (c) measuring a power supply current consumed by the semiconductor circuit during said standby mode; and
   (d) repeating steps (a) to (c) with different input test data.

2. A semiconductor integrated circuit for facilitating a standby current test comprising:

a plurality of transfer gates each of which include a single transistor having a threshold voltage, the output terminals of said transfer gates being tied to each other;
   an output circuit connected to said output terminals of said transfer gates for outputting a full logic level; and
   a feedback circuit connected between the output and input terminals of said output circuit for compensating the voltage at the input terminal of said output circuit for the threshold voltage of said single transistor.

3. The semiconductor integrated circuit facilitating a standby current test as claimed in claim 2 wherein said output circuit is an invertor.

4. The semiconductor integrated circuit facilitating a standby current test as claimed in claim 2 wherein said feedback circuit is an invertor.

5. The semiconductor integrated circuit facilitating a standby current test as claimed in claim 4 wherein said feedback circuit is a clocked invertor.

6. The semiconductor integrated circuit facilitating a standby current test as claimed in claim 4 wherein said output circuit and said feedback circuit form a latch circuit.

* * * * *